US012776378B2

(12) United States Patent
Abinaya et al.

(10) Patent No.: US 12,776,378 B2
(45) Date of Patent: Oct. 27, 2026

(54) MEMORY CONFIGURED TO RESUME A SUSPENDED ERASE OPERATION WITH A VARIABLE ERASE VOLTAGE

(71) Applicant: MICRON TECHNOLOGY, INC., Boise, ID (US)

(72) Inventors: Kannan Abinaya, Singapore (SG); Shyam Sunder Raghunathan, Singapore (SG); Dheeraj Srinivasan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 18/975,325

(22) Filed: Dec. 10, 2024

(65) Prior Publication Data

US 2025/0210116 A1 Jun. 26, 2025

Related U.S. Application Data

(60) Provisional application No. 63/614,758, filed on Dec. 26, 2023.

(51) Int. Cl.
*G11C 16/34* (2006.01)
*G11C 16/04* (2006.01)
*G11C 16/14* (2006.01)

(52) U.S. Cl.
CPC ...... *G11C 16/3445* (2013.01); *G11C 16/0483* (2013.01); *G11C 16/14* (2013.01)

(58) Field of Classification Search
CPC .. G11C 16/3445; G11C 16/0483; G11C 16/14
See application file for complete search history.

(56) References Cited

U.S. PATENT DOCUMENTS

| | | | |
|---|---|---|---|
| 11,237,754 B2 | 2/2022 | Guda et al. | |
| 11,875,858 B2 | 1/2024 | Tanaka | |
| 2022/0206712 A1 | 6/2022 | Siciliani et al. | |
| 2023/0360708 A1* | 11/2023 | Shukla | G11C 16/3445 |

* cited by examiner

*Primary Examiner* — Han Yang
(74) *Attorney, Agent, or Firm* — Dicke, Billig & Czaja, PLLC

(57) ABSTRACT

Memories might include an array of memory cells having a plurality of strings of series-connected memory cells and a controller configured to cause to memory to apply an erase pulse having a target voltage level and having an erase pulse flattop; for each suspend of a plurality of suspends initiated during the application of the erase pulse flattop, increase a value of the target voltage level; and resume applying the erase pulse having the target voltage level until initiation of any subsequent suspend of the plurality of suspends. Such controllers might further be configured to cause the memory to maintain the value of the target voltage level for each suspend of one or more additional suspends initiated during the application of the erase pulse flattop, and resume applying the erase pulse having the target voltage level until initiation of any subsequent suspend of the one or more additional suspends.

20 Claims, 12 Drawing Sheets

MEMORY CONFIGURED TO RESUME A SUSPENDED ERASE OPERATION WITH A VARIABLE ERASE VOLTAGE

RELATED APPLICATION

This application claims the benefit of U.S. Provisional Application No. 63/614,758, filed on Dec. 26, 2023, hereby incorporated herein in its entirety by reference.

TECHNICAL FIELD

The present disclosure relates generally to integrated circuits, and, in particular, in one or more embodiments, the present disclosure relates to memories configured to resume a suspended erase operation with a variable erase voltage.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC might use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Memory cells are typically erased before they are programmed to a desired data state. For example, memory cells of a particular block of memory cells might first be erased and then selectively programmed. For a NAND array, a block of memory cells is typically erased by grounding all of the access lines (e.g., word lines) in the block and applying an erase voltage to the channel regions of the memory cells (e.g., through data line and/or source connection) in order to remove charges that might be stored on data-storage structures (e.g., floating gates or charge traps) of the block of memory cells. Typical erase voltages might be on the order of 20V or more before completion of an erase operation.

DETAILED DESCRIPTION

Figure 1:
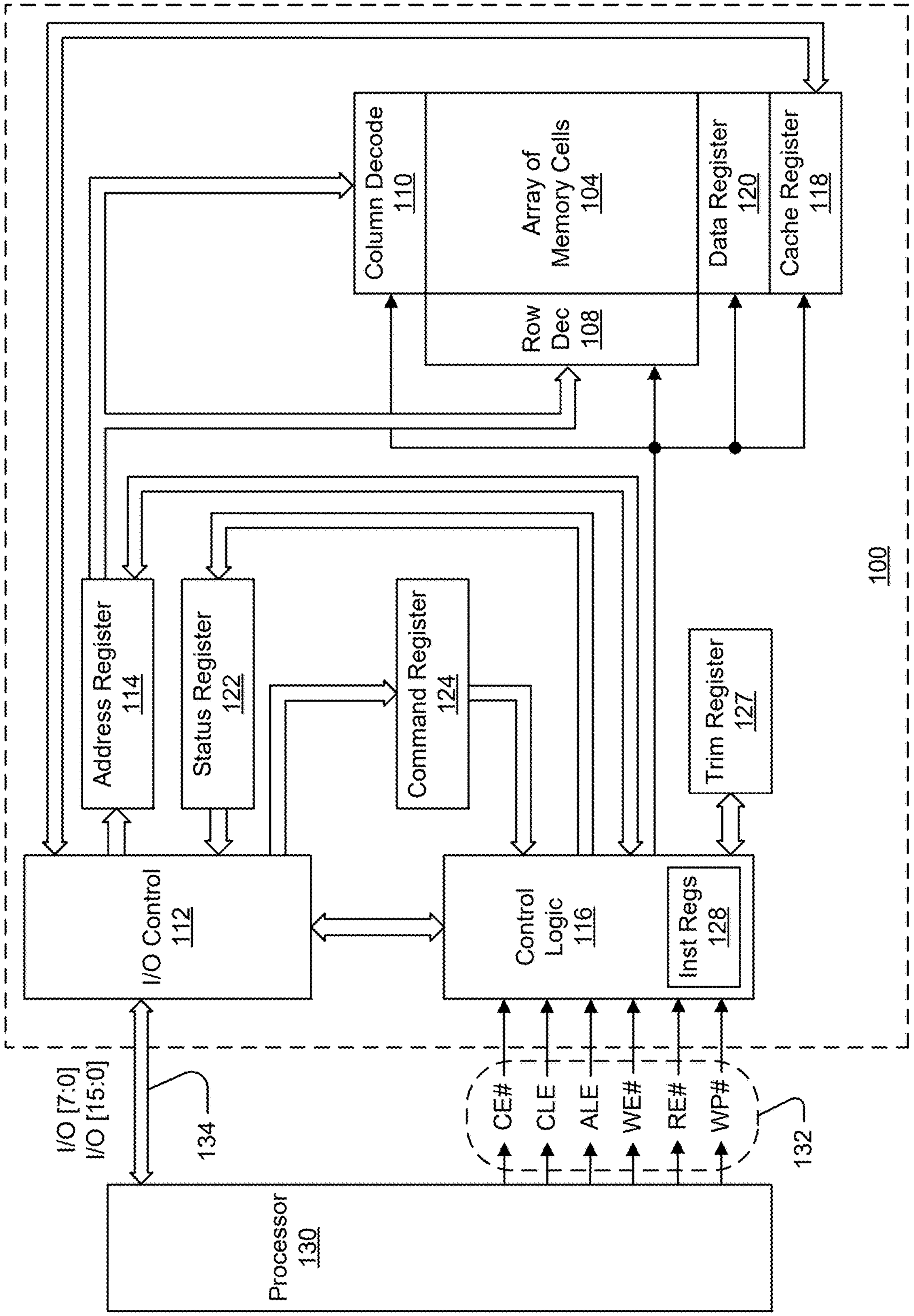
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term “semiconductor” used herein can refer to, for example, a layer of material, a wafer, or a substrate, and includes any base semiconductor structure. “Semiconductor” is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

As used herein, multiple acts being performed concurrently will mean that each of these acts is performed for a respective time period, and each of these respective time periods overlaps, in part or in whole, with each of the remaining respective time periods. In other words, portions of each of those acts are simultaneously performed for at least some period of time.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

NAND memory typically supports three major access operations: erase operations, programming operations, and read operations. In general, erase operations tend to be the slowest of the three major operations, with several phases including startup overhead (e.g., partial block erase check, pre-program, etc.), erase pulse, erase verify, and closing overhead (e.g., anneal pulse, SG check, etc.). In contrast, read operations tend to be the fastest of the three major operations and also tend to have the highest priority at the system level. As such, to support read commands from a host (e.g., external host) in a timely manner, other operations, e.g., erase operations or program operations, might be suspended in order to perform a requested read operation. Following execution of the read operation, the suspended operation might be resumed with the appropriate phase to ensure successful continuation (e.g., forward progress) of the operation.

In an erase operation, the erase pulse might be the longest (e.g., up to a millisecond or more) of its phases. To improve system efficiency and facilitate forward progress for an erase operation suspended during an erase pulse phase, the erase pulse flattop (e.g., steady-state application of the target voltage level of the erase pulse) might be divided (e.g., uniformly divided) into segments, and the length of each segment might be controlled by a trim setting. Segmenting the erase pulse flattop might facilitate processing a suspend command (e.g., issued during a segment of an erase pulse) immediately after finishing the segment of the erase pulse flattop. Upon resuming the erase operation, the erase operation might continue with only the remaining segments of the erase pulse flattop. In addition, in such cases, the erase verify phase might be disabled when resuming following a suspension during the flattop of the erase pulse.

The combined erase capability of applying an erase pulse flattop in a segmented fashion (e.g., due to one or more suspends initiated during the erase pulse) might be expected to match to that of applying the erase pulse flattop in a continuous fashion (e.g., with no suspend initiated during the erase pulse). However, it has been found that applying an erase pulse flattop in a segmented fashion generally leads to a shallower erase than applying the erase pulse flattop in a continuous fashion, which can cause one or more additional erase pulses before passing an erase verify operation. In cases where the erase verify on resume is disabled, this can risk a deeper erase than desired.

In addition, it has been found that the combined erase capability of applying an erase pulse flattop in a segmented fashion varies depending on the duration of the erase pulse flattop executed prior to initiating a suspend, with efficacy reducing as the average duration of the erase pulse flattop per suspend decreases. Various embodiments facilitate a decrease in the difference between applying an erase pulse flattop in a segmented fashion and applying an erase pulse flattop in a continuous fashion by varying the target voltage level of the erase pulse in response to the numbers of segments executed before each suspension of the erase operation.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A trim register 127 might be in communication with the control logic 116. The trim register 127 might represent a volatile memory, latches or other storage location, volatile or non-volatile. For some embodiments, the trim register 127 might represent a portion of the array of memory cells 104. The trim register 127 might store information relating offsets to be used in varying the target voltage level of an erase pulse in accordance with embodiments.

A controller (e.g., the control logic 116 internal to the memory device 100) controls access to the array of memory cells 104 in response to the commands and might generate status information for the external processor 130, i.e., control logic 116 is configured to perform array operations (e.g., sensing operations [which might include read operations and verify operations], programming operations and/or erase operations) on the array of memory cells 104 in accordance with embodiments. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104, then new data might be latched in the cache register 118 from the I/O control circuitry 112. During a read operation, data might be passed from the cache register 118 to the I/O control circuitry 112 for output to the external processor 130, then new data might be passed from the data register 120 to the cache register 118. The cache register 118 and/or the data register 120 might form (e.g., might form a portion of) a page buffer of the memory device 100. A data register 120 might further include sense circuits (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
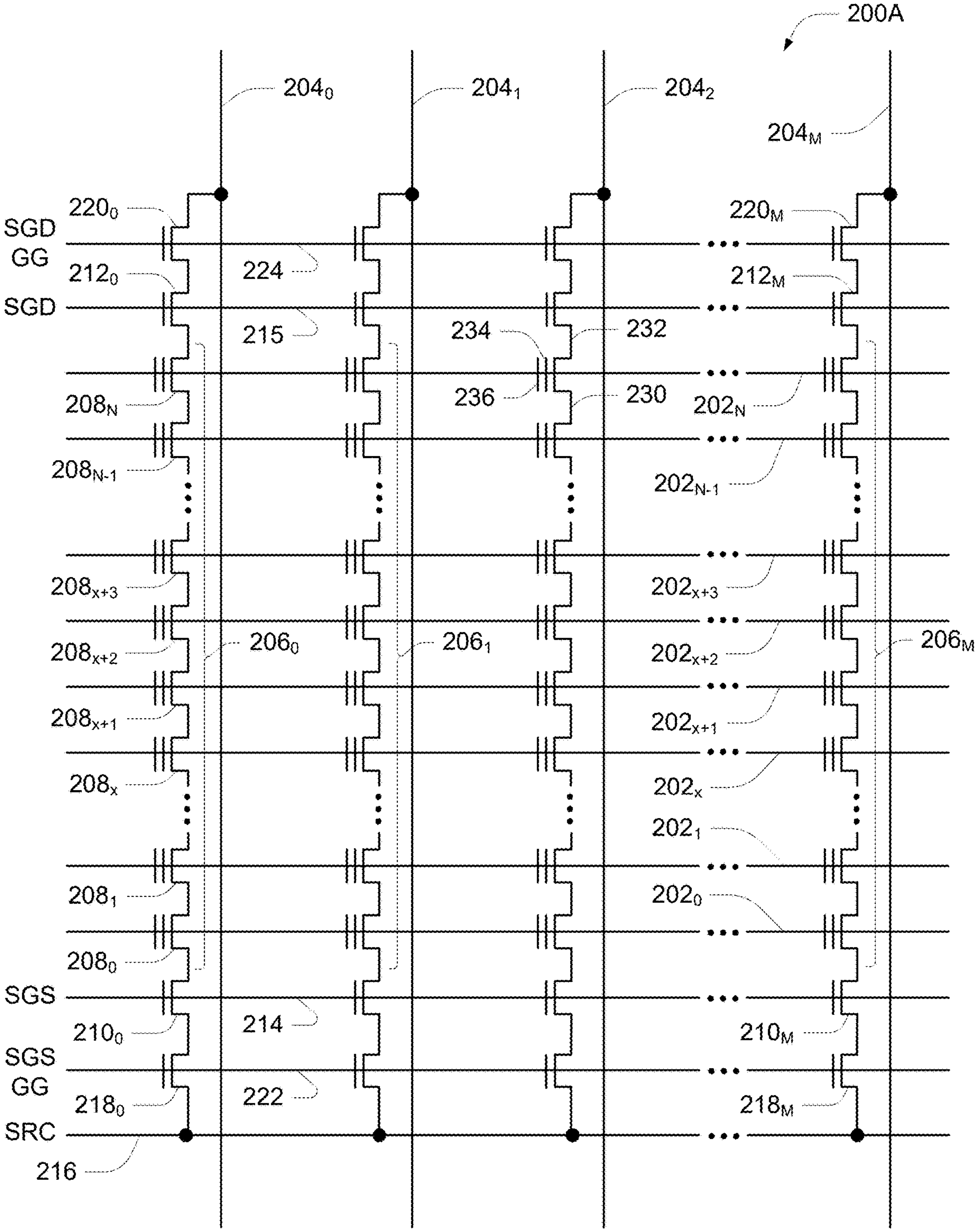
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $\mathbf{202}_0$ to $\mathbf{202}_N$, and data lines, such as bit lines $\mathbf{204}_0$ to $\mathbf{204}_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $\mathbf{206}_0$ to $\mathbf{206}_M$. Each NAND string 206 might be connected (e.g., selectively connected) to a common source (SRC) 216 and might include memory cells $\mathbf{208}_0$ to $\mathbf{208}_N$. The memory cells 208 might represent non-volatile memory cells for storage of data. Some of the memory cells 208 might represent dummy memory cells, e.g., memory cells not intended to store user data. Dummy memory cells are typically not accessible to a user of the memory, and are typically incorporated into the NAND string 206 for operational advantages, as are well understood.

The memory cells 208 of each NAND string 206 might be connected in series between a select gate 210 (e.g., a field-effect transistor), such as one of the select gates $\mathbf{210}_0$ to $\mathbf{210}_M$ (e.g., that might be source select transistors, commonly referred to as select gate source), and a select gate 212 (e.g., a field-effect transistor), such as one of the select gates $\mathbf{212}_0$ to $\mathbf{212}_M$ (e.g., that might be drain select transistors, commonly referred to as select gate drain). Select gates $\mathbf{210}_0$ to $\mathbf{210}_M$ might be commonly connected to a select line 214, such as a source select line (SGS), and select gates $\mathbf{212}_0$ to $\mathbf{212}_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal. A control gate of each select gate 210 might be connected to select line 214. A control gate of each select gate 212 might be connected to select line 215.

The select gates 210 for each NAND string 206 might be connected in series between its memory cells 208 and a GIDL (gate-induced drain leakage) generator gate 218 (e.g., a field-effect transistor), such as one of the GIDL generator (GG) gates $\mathbf{218}_0$ to $\mathbf{218}_M$. The GG gates $\mathbf{218}_0$ to $\mathbf{218}_M$ might be referred to as source GG gates. The source GG gates $\mathbf{218}_0$ to $\mathbf{218}_M$ might each be connected (e.g., directly connected) to the source 216, and selectively connected to their respective NAND strings $\mathbf{206}_0$ to $\mathbf{206}_M$. Alternatively, a source select gate 210 and its GG gate 218 might represent a single gate, e.g., connected (e.g., directly connected) to the source 216, and connected (e.g., directly connected) to a respective NAND string 206. The select gates 212 of each NAND string 206 might be connected in series between its memory cells 208 and a GG gate 220 (e.g., a field-effect transistor), such as one of the GG gates $\mathbf{220}_0$ to $\mathbf{220}_M$. The GG gates $\mathbf{220}_0$ to $\mathbf{220}_M$ might be referred to as drain GG gates. The drain GG gates $\mathbf{220}_0$ to $\mathbf{220}_M$ might be connected (e.g., directly connected) to their respective data lines $\mathbf{204}_0$ to $\mathbf{204}_M$, and selectively connected to their respective NAND strings $\mathbf{206}_0$ to $\mathbf{206}_M$. Alternatively, a drain select gate 212 and its GG gate 220 might represent a single gate, e.g., connected (e.g., directly connected) to a respective data line 204, and connected (e.g., directly connected) to a respective NAND string 206.

GG gates $\mathbf{218}_0$ to $\mathbf{218}_M$ might be commonly connected to a control line 222, such as an SGS_GG control line, and GG gates $\mathbf{220}_0$ to $\mathbf{220}_M$ might be commonly connected to a control line 224, such as an SGD_GG control line. Although depicted as traditional field-effect transistors, the GG gates 218 and 220 might utilize a structure similar to (e.g., the same as) the memory cells 208. The GG gates 218 and 220 might represent a plurality of GG gates connected in series, with each GG gate in series configured to receive a same or independent control signal. In general, the GG gates 218 and 220 might have threshold voltages different than (e.g., lower than) the threshold voltages of the select gates 210 and 212, respectively. Threshold voltages of the source GG gates 218 might be different than (e.g., higher than) threshold voltages of the drain GG gates 220. Threshold voltages of the GG gates 218 and 220 might be of an opposite polarity than, and/or might be lower than, threshold voltages of the select gates 210 and 212. For example, the select gates 210 and 212 might have positive threshold voltages (e.g., 2V to 4V), while the GG gates 218 and 220 might have negative threshold voltages (e.g., −1V to −4V). The GG gates 218 and 220 might be provided to assist in the generation of GIDL current into a channel region of their corresponding NAND string 206 during an erase operation, for example.

A source of each GG gate 218 might be connected to common source 216. The drain of each GG gate 218 might be connected to a select gate 210 of the corresponding NAND string 206. For example, the drain of GG gate $\mathbf{218}_0$ might be connected to the source of select gate $\mathbf{210}_0$ of the corresponding NAND string $\mathbf{206}_0$. Therefore, in cooperation, each select gate 210 and GG gate 218 for a corresponding NAND string 206 might be configured to selectively connect that NAND string 206 to common source 216. A control gate of each GG gate 218 might be connected to control line 222.

The drain of each GG gate 220 might be connected to the bit line 204 for the corresponding NAND string 206. For example, the drain of GG gate $\mathbf{220}_0$ might be connected to the bit line $\mathbf{204}_0$ for the corresponding NAND string $\mathbf{206}_0$. The source of each GG gate 220 might be connected to a select gate 212 of the corresponding NAND string 206. For example, the source of GG gate $\mathbf{220}_0$ might be connected to select gate $\mathbf{212}_0$ of the corresponding NAND string $\mathbf{206}_0$. Therefore, in cooperation, each select gate 212 and GG gate 220 for a corresponding NAND string 206 might be configured to selectively connect that NAND string 206 to the corresponding bit line 204. A control gate of each GG gate 220 might be connected to control line 224.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $\mathbf{202}_N$ and selectively connected to even bit lines 204 (e.g., bit lines $\mathbf{204}_0$, $\mathbf{204}_2$, $\mathbf{204}_4$, etc.) might be one physical page of memory cells 208 (e.g., even memory cells) while memory cells 208 commonly connected to word line $\mathbf{202}_N$ and selectively connected to odd bit lines 204 (e.g., bit lines $\mathbf{204}_1$, $\mathbf{204}_3$, $\mathbf{204}_5$, etc.) might be another physical page of memory cells 208 (e.g., odd memory cells). Although bit lines $\mathbf{204}_3$-$\mathbf{204}_5$ are not explicitly depicted in FIG. 2A, it is apparent from the figure that the bit lines 204 of the array of memory cells 200A might be numbered consecutively from bit line $\mathbf{204}_0$ to bit line $\mathbf{204}_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines 202$_0$-202$_N$(e.g., all NAND strings 206 sharing common word lines 202). Unless expressly distinguished, a reference to a page of memory cells herein refers to the memory cells of a logical page of memory cells.

Figure 2B:
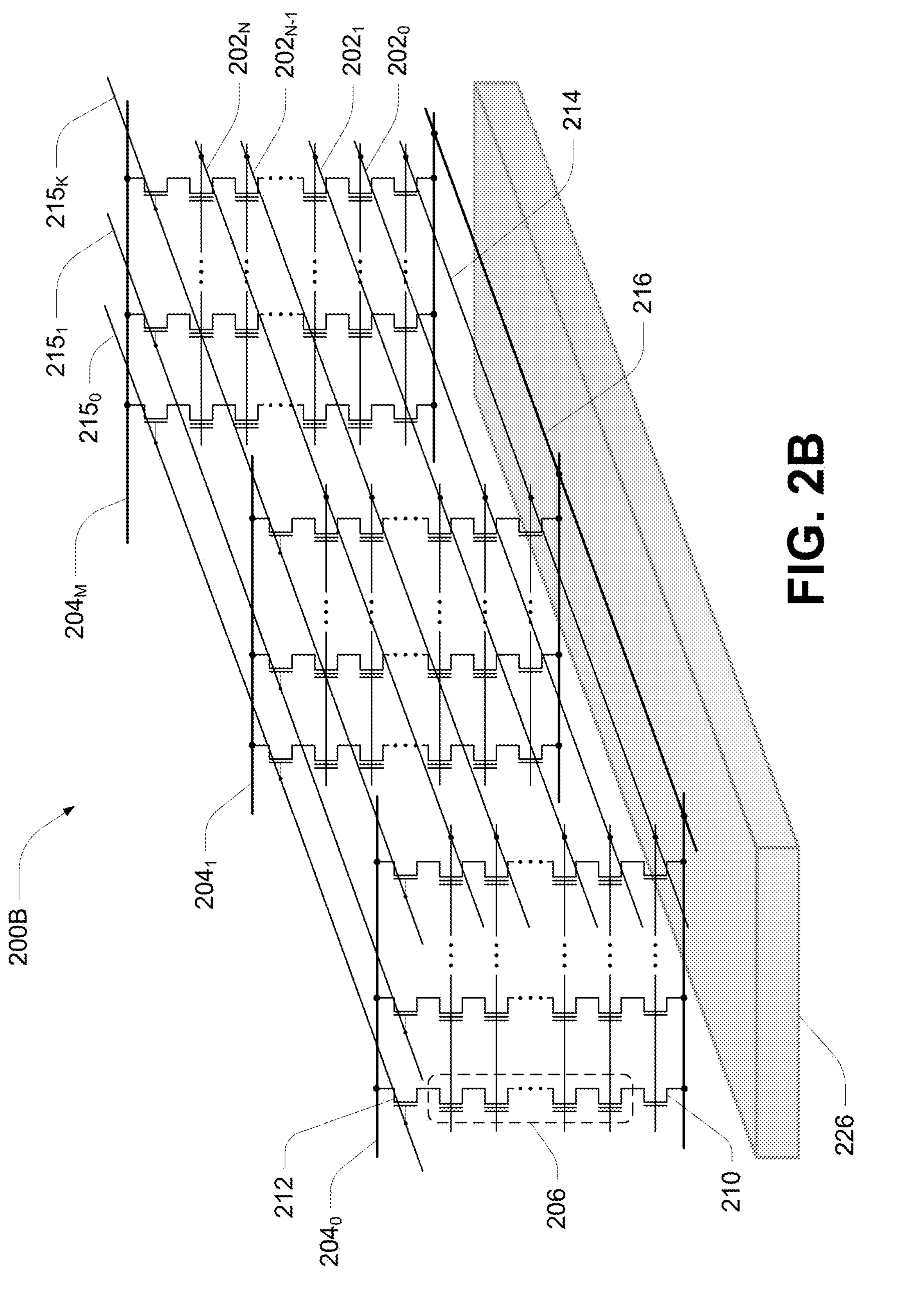

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. For clarity, the GG gates and their control lines are not depicted in FIG. 2B.

The three-dimensional NAND memory array 200B might incorporate vertical structures which might include semiconductor pillars, which might be solid or hollow, where a portion of a pillar might act as a channel region of the memory cells of NAND strings 206, e.g., a region through which current might flow when a memory cell, e.g., a field-effect transistor, is activated. The NAND strings 206 might be each selectively connected to a data line 204$_0$-204$_M$ by a select gate 212 (e.g., that might be drain select transistors, commonly referred to as select gate drain) and to a common source 216 by a select gate 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines 215$_0$-215$_k$ to selectively activate particular select gates 212 each between a NAND string 206 and a data line 204. The select gates 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel region and p-channel region transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
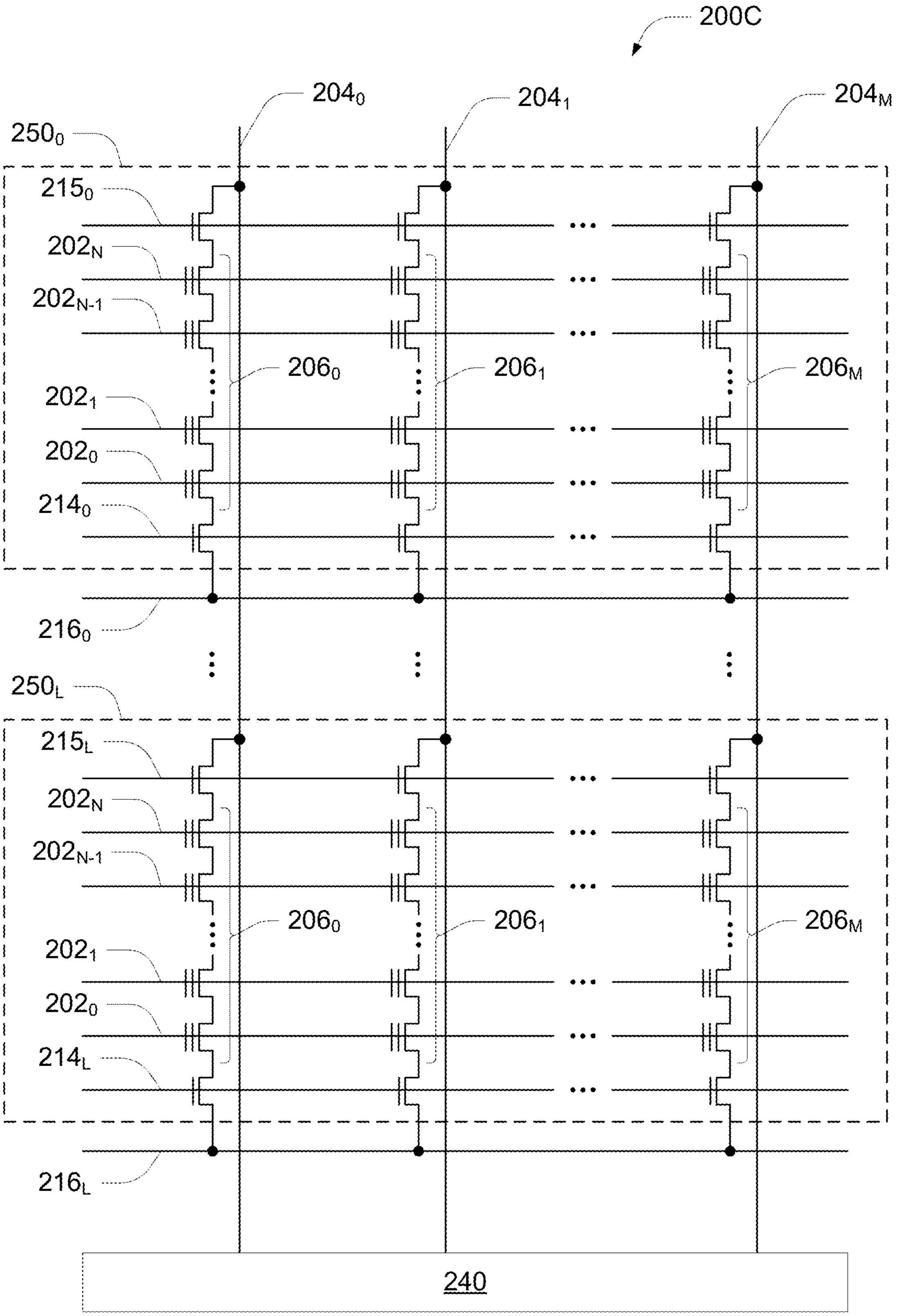

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. For clarity, the GG gates and their control lines are not depicted in FIG. 2C.

Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells 250$_0$-250$_L$. Blocks of memory cells 250 might be groupings of memory cells 208 that might be erased together in a single erase operation, sometimes referred to as erase blocks. Each block of memory cells 250 might represent those NAND strings 206 commonly associated with a single select line 215, e.g., select line 215$_0$. The source 216 for the block of memory cells 250$_0$ might be a same source as the source 216 for the block of memory cells 250$_L$. For example, each block of memory cells 250$_0$-250$_L$ might be commonly selectively connected to the source 216. Access lines 202 and select lines 214 and 215 of one block of memory cells 250 might have no direct connection to access lines 202 and select lines 214 and 215, respectively, of any other block of memory cells of the blocks of memory cells 250$_0$-250$_L$.

The data lines 204$_0$-204$_M$ might be connected (e.g., selectively connected) to a buffer portion 240, which might be a portion of a page buffer of the memory. The buffer portion 240 might correspond to a memory plane (e.g., the set of blocks of memory cells 250$_0$-250$_L$). The buffer portion 240 might include sense circuits (not shown in FIG. 2C) for sensing data values indicated on respective data lines 204.

Figure 3A:
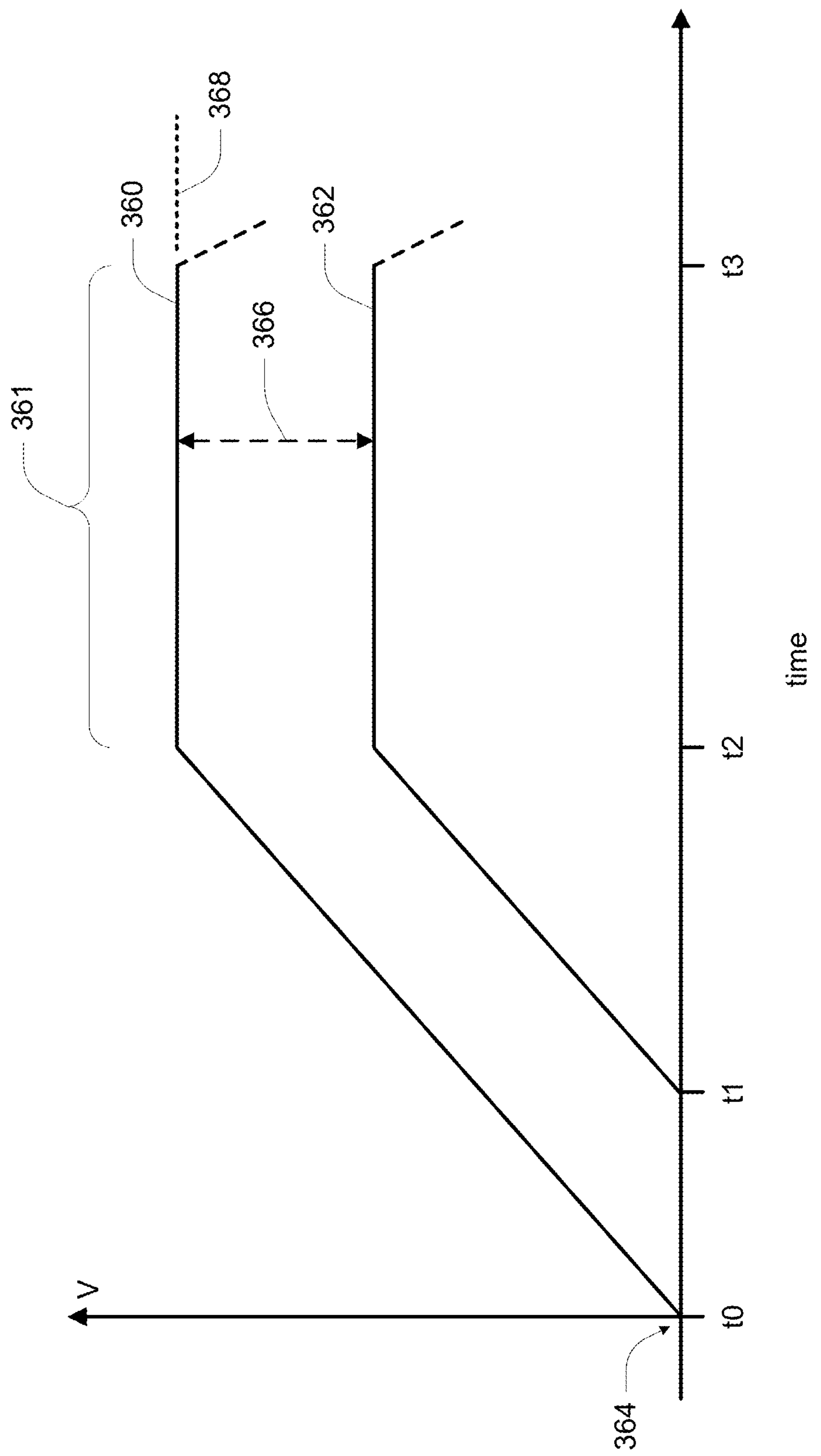
FIG. 3A conceptually depicts waveforms of voltage levels for generating GIDL current while applying an erase pulse of an erase operation in a continuous fashion.

FIG. 3A conceptually depicts waveforms of voltage levels for generating GIDL current while applying an erase pulse of an erase operation. In FIG. 3A, the waveform 360 might represent the voltage level, e.g., the erase pulse, applied to a node, e.g., one or more nodes selected from the common source 216 and/or the data line 204. The waveform 362 might represent the voltage level applied to the control line 222 and/or control line 224 while applying the erase pulse to the source 216 and/or data line 204, respectively. The erase operation might be configured to erase the memory cells of a block of memory cells.

At time t0, the voltage level of the waveform 360 might begin increasing (e.g., ramping) from an initial voltage level 364 (e.g., ground or 0V) while the voltage level of the waveform 362 might remain at the initial voltage level. As a result, a voltage difference between the waveform 360 and the waveform 362 might begin increasing in magnitude. At time t1, the voltage difference between the waveform 360 and the waveform 362 might reach a target (e.g., desired) magnitude 366, and the voltage level of the waveform 362 might begin increasing from the initial voltage level at a same rate (e.g., a same ramp rate) as the rate of increase of the voltage level of the waveform 360 to maintain the magnitude 366 of the voltage difference between the waveform 360 and the waveform 362.

At time t2, the voltage level of the waveform 360 might reach a target (e.g., desired) voltage level 368 for the erase pulse. At this time, the voltage levels of the waveforms 360 and 362 might be maintained, e.g., by ceasing increasing their respective voltage levels. In reference to FIG. 3A, the desired levels of GIDL current might only be produced after time t1 when the magnitude 366 of the voltage difference between the waveform 360 and the waveform 362 reaches its target level.

The waveform 360 might have an erase pulse flattop 361 corresponding to a desired duration (e.g., time t3-time t2) of maintaining the target voltage level 368 for the erase pulse, e.g., waveform 360. At the conclusion of the erase pulse flattop 361 at time t3, the voltage levels of the waveforms 360 and 362 might be discharged. At this point, an erase verify operation might be performed to determine whether the memory cells have been sufficiently erased. If the erase verify operation passes, and the memory cells are deemed to be sufficiently erased, the erase operation might be complete. If the erase verify operation fails, and the memory cells are not deemed to be sufficiently erased, a next erase pulse might be applied to the source 216 and/or data line 204 having a higher target voltage level. The next erase pulse typically is a predetermined value higher than the present erase pulse.

Figure 3B:
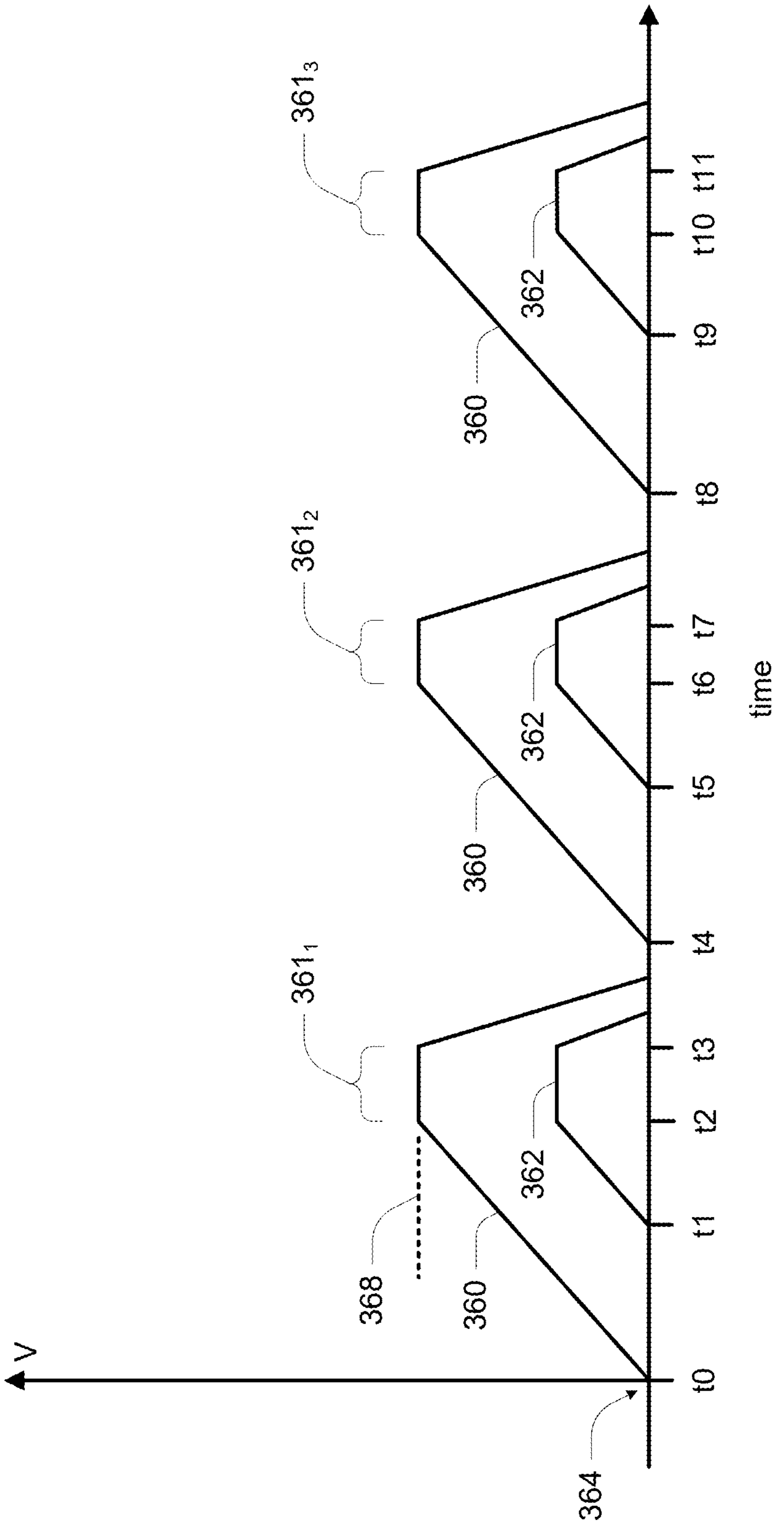
FIG. 3B conceptually depicts waveforms of voltage levels for generating GIDL current while applying an erase pulse of an erase operation in a segmented fashion.

While the example of FIG. 3A depicts the erase pulse to be applied without interruption, it might be common to suspend erase operations during application of the erase pulse. FIG. 3B depicts an example of the same erase pulse being interrupted by two suspends initiated during the erase pulse flattop. While a suspend could be initiated prior to or subsequent to the erase pulse flattop, the present disclosure is not focused on those scenarios, and they are not addressed in the example of FIG. 3B.

FIG. 3B conceptually depicts waveforms of voltage levels for generating GIDL current while applying an erase pulse of an erase operation. In FIG. 3B, the waveform 360 might represent the voltage level, e.g., the erase pulse, applied to a node, e.g., one or more nodes selected from the common source 216 and/or the data line 204. The waveform 362 might represent the voltage level applied to the control line 222 and/or control line 224 while applying the erase pulse to the source 216 and/or data line 204, respectively.

At time t0, the voltage level of the waveform 360 might begin increasing (e.g., ramping) from an initial voltage level 364 (e.g., ground or 0V) while the voltage level of the waveform 362 might remain at the initial voltage level. As a result, a voltage difference between the waveform 360 and the waveform 362 might begin increasing in magnitude. At time t1, the voltage difference between the waveform 360 and the waveform 362 might reach a target (e.g., desired) magnitude, and the voltage level of the waveform 362 might begin increasing from the initial voltage level at a same rate (e.g., a same ramp rate) as the rate of increase of the voltage level of the waveform 360 to maintain the magnitude of the voltage difference between the waveform 360 and the waveform 362.

At time t2, the voltage level of the waveform 360 might reach a target (e.g., desired) voltage level 368 for the erase pulse. At this time, the voltage levels of the waveforms 360 and 362 might be maintained, e.g., by ceasing increasing their respective voltage levels. In reference to FIG. 3B, the desired levels of GIDL current might be produced after time t1 when the magnitude of the voltage difference between the waveform 360 and the waveform 362 reaches its target level.

The waveform 360 might have a partial erase pulse flattop $\mathbf{361}_1$. A suspend might be initiated at time t3, and the voltage levels of the waveforms 360 and 362 might be discharged in response. Because a suspend was initiated prior to completion of a desired duration of the erase pulse flattop of the erase pulse of FIG. 3B, the duration of the partial erase pulse flattop $\mathbf{361}_1$ of FIG. 3B might be shorter than the duration of the erase pulse flattop 361 of FIG. 3A, even where the waveform 360 of FIG. 3B represents a same erase pulse of an erase operation as the waveform 360 of FIG. 3A. Note that a suspend might be initiated in response to a command (e.g., a suspend command) from an external controller, e.g., a processor 130, in communication with the memory. Alternatively, or in addition, a suspend might be initiated autonomously by an internal controller, e.g., control logic 116, of the memory, such as in response to having a pending command for a conflicting access operation having a higher priority, e.g., a read command. An access operation will be deemed to be conflicting with an erase operation if the two operations cannot be performed concurrently or if the memory is otherwise configured to not permit performance of the two operations concurrently.

At time t4, the suspend might be completed and a resume of the erase pulse might be initiated. Note that a resume might be initiated in response to a command (e.g., a resume command) from an external controller, e.g., a processor 130, in communication with the memory. Alternatively, or in addition, a resume might be initiated autonomously by an internal controller, e.g., control logic 116, of the memory, such as in response to having no pending command for a conflicting access operation having a higher priority. As such, at time t4, the voltage level of the waveform 360 might begin increasing (e.g., ramping) from the initial voltage level 364 (e.g., ground or 0V) while the voltage level of the waveform 362 might remain at the initial voltage level. At time t5, the voltage difference between the waveform 360 and the waveform 362 might reach the target (e.g., desired) magnitude, and the voltage level of the waveform 362 might begin increasing from the initial voltage level at a same rate (e.g., a same ramp rate) as the rate of increase of the voltage level of the waveform 360 to maintain the magnitude of the voltage difference between the waveform 360 and the waveform 362.

At time t6, the voltage level of the waveform 360 might reach the target (e.g., desired) voltage level 368 for the erase pulse. At this time, the voltage levels of the waveforms 360 and 362 might be maintained, e.g., by ceasing increasing their respective voltage levels. In reference to FIG. 3B, the desired levels of GIDL current might be produced after time t5 when the magnitude of the voltage difference between the waveform 360 and the waveform 362 reaches its target level.

The waveform 360 might have a second partial erase pulse flattop $\mathbf{361}_2$. A second suspend might be initiated at time t7, and the voltage levels of the waveforms 360 and 362 might be discharged in response. The duration of the second partial erase pulse flattop $\mathbf{361}_2$ of FIG. 3B might be shorter than the duration of the erase pulse flattop 361 of FIG. 3A, even where the waveform 360 of FIG. 3B represents a same erase pulse of an erase operation as the waveform 360 of FIG. 3A.

At time t8, the second suspend might be completed and a second resume of the erase pulse might be initiated. As such, at time t8, the voltage level of the waveform 360 might begin increasing (e.g., ramping) from the initial voltage level 364 (e.g., ground or 0V) while the voltage level of the waveform 362 might remain at the initial voltage level. At time t9, the voltage difference between the waveform 360 and the waveform 362 might reach the target (e.g., desired) magnitude, and the voltage level of the waveform 362 might begin increasing from the initial voltage level at a same rate (e.g., a same ramp rate) as the rate of increase of the voltage level of the waveform 360 to maintain the magnitude of the voltage difference between the waveform 360 and the waveform 362.

At time t10, the voltage level of the waveform 360 might reach the target (e.g., desired) voltage level 368 for the erase pulse. At this time, the voltage levels of the waveforms 360 and 362 might be maintained, e.g., by ceasing increasing their respective voltage levels. In reference to FIG. 3B, the desired levels of GIDL current might be produced after time t9 when the magnitude of the voltage difference between the waveform 360 and the waveform 362 reaches its target level.

The waveform 360 might have a third partial erase pulse flattop $\mathbf{361}_3$. At time t11, a sum of the durations of the first partial erase pulse flattop $\mathbf{361}_1$, the second partial erase pulse flattop $\mathbf{361}_2$, and the third partial erase pulse flattop $\mathbf{361}_3$ of FIG. 3B might equal the duration of the erase pulse flattop 361 of FIG. 3A for corresponding erase pulses of an erase operation. At this time, the erase pulse might be deemed to be complete and the voltage levels of the waveforms 360 and 362 might be discharged.

Figure 4:
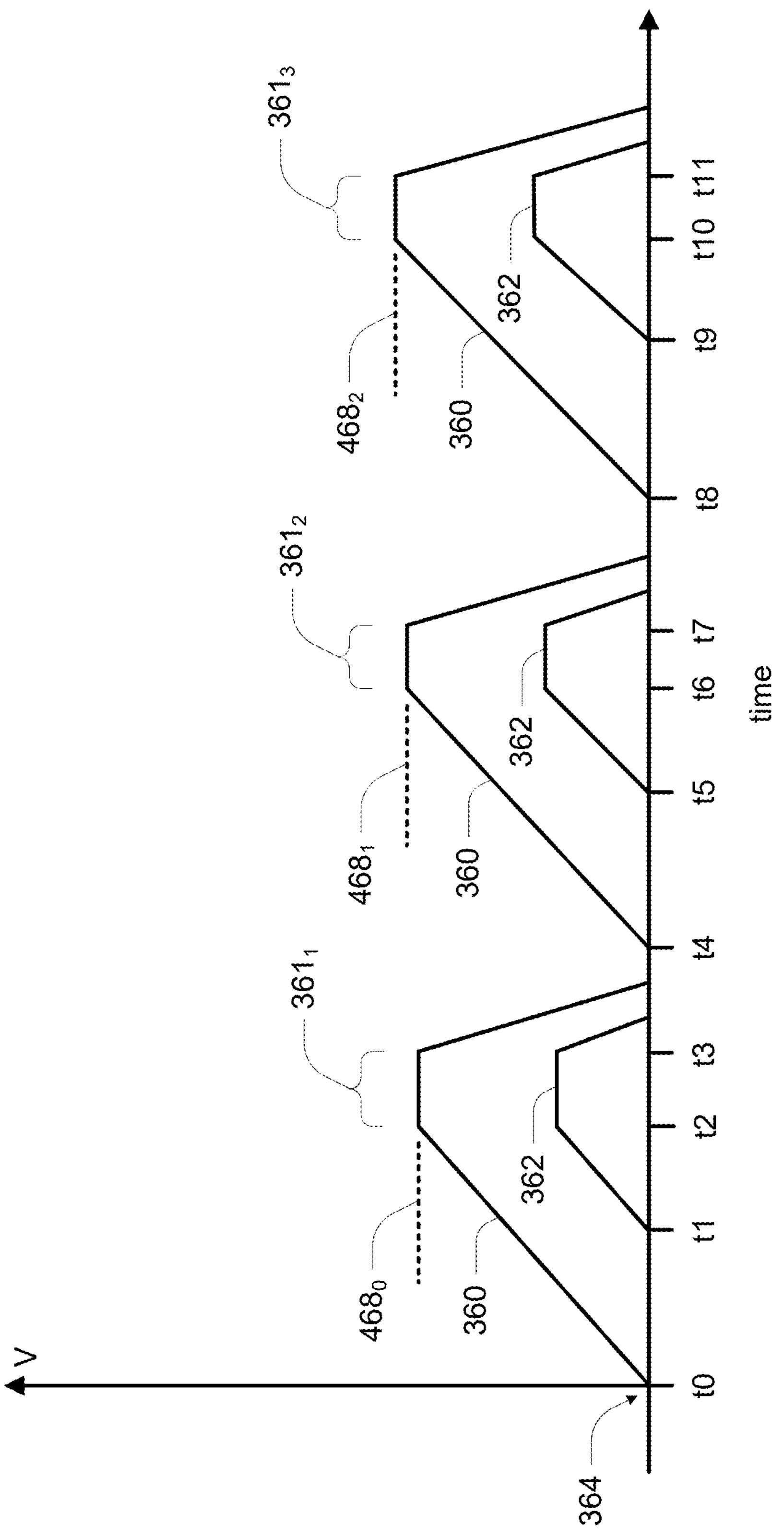
FIG. 4 conceptually depicts waveforms of voltage levels for generating GIDL current while applying an erase pulse of an erase operation in a segmented fashion in accordance with an embodiment.

While the combined duration of the partial erase pulse flattops $361_1$-$361_3$ of FIG. 3B might be equal to the duration of the erase pulse flattop 361 of FIG. 3A, the efficacy of the erase pulse of FIG. 3B might be less than the efficacy of the erase pulse of FIG. 3A, leading to shallower levels of erase as previously noted. This might be due to the GIDL currents generated during the ramping portions (e.g., time t1 to time t2, time t5 to time t6, and time t9 to time t10 of FIG. 3B) being insufficient to bring the channels of the memory cells up to their desired voltage levels by the time the erase pulse reaches its target voltage level. To address this, various embodiments increase the target voltage level of the erase pulse following each of one or more suspends initiated during the erase pulse flattop. FIG. 4 depicts an example of this concept. While a suspend could be initiated prior or subsequent to the erase pulse flattop, the present disclosure is not focused on those scenarios, and they are not addressed in the example of FIG. 4.

FIG. 4 conceptually depicts waveforms of voltage levels for generating GIDL current while applying an erase pulse of an erase operation in accordance with an embodiment. In FIG. 4, the waveform 360 might represent the voltage level, e.g., the erase pulse, applied to a node, e.g., one or more nodes selected from the common source 216 and/or the data line 204. The waveform 362 might represent the voltage level applied to the control line 222 and/or control line 224 while applying the erase pulse to the source 216 and/or data line 204, respectively.

At time t0, the voltage level of the waveform 360 might begin increasing (e.g., ramping) from an initial voltage level 364 (e.g., ground or 0V) while the voltage level of the waveform 362 might remain at the initial voltage level. As a result, a voltage difference between the waveform 360 and the waveform 362 might begin increasing in magnitude. At time t1, the voltage difference between the waveform 360 and the waveform 362 might reach a target (e.g., desired) magnitude, and the voltage level of the waveform 362 might begin increasing from the initial voltage level at a same rate (e.g., a same ramp rate) as the rate of increase of the voltage level of the waveform 360 to maintain the magnitude of the voltage difference between the waveform 360 and the waveform 362.

At time t2, the voltage level of the waveform 360 might reach an initial target (e.g., desired) voltage level $468_0$ for the erase pulse. At this time, the voltage levels of the waveforms 360 and 362 might be maintained, e.g., by ceasing increasing their respective voltage levels. In reference to FIG. 4, the desired levels of GIDL current might be produced after time t1 when the magnitude of the voltage difference between the waveform 360 and the waveform 362 reaches its target level.

The waveform 360 might have a partial erase pulse flattop $361_1$. A suspend might be initiated at time t3, and the voltage levels of the waveforms 360 and 362 might be discharged in response. Because a suspend was initiated prior to completion of a desired duration of the erase pulse flattop of the erase pulse of FIG. 4, the duration of the partial erase pulse flattop $361_1$ of FIG. 4 might be shorter than the duration of the erase pulse flattop 361 of FIG. 3A, even where the waveform 360 of FIG. 4 represents a same erase pulse of an erase operation as the waveform 360 of FIG. 3A. Note that a suspend might be initiated in response to a command (e.g., a suspend command) from an external controller, e.g., a processor 130, in communication with the memory. Alternatively, or in addition, a suspend might be initiated autonomously by an internal controller, e.g., control logic 116, of the memory, such as in response to having a pending command for a conflicting access operation having a higher priority, e.g., a read command.

At time t4, the suspend might be completed and a resume of the erase pulse might be initiated. Note that a resume might be initiated in response to a command (e.g., a resume command) from an external controller, e.g., a processor 130, in communication with the memory. Alternatively, or in addition, a resume might be initiated autonomously by an internal controller, e.g., control logic 116, of the memory, such as in response to having no pending command for a conflicting access operation having a higher priority. As such, at time t4, the voltage level of the waveform 360 might begin increasing (e.g., ramping) from the initial voltage level 364 (e.g., ground or 0V) to a second target (e.g., desired) voltage level $468_1$ while the voltage level of the waveform 362 might remain at the initial voltage level. In contrast to the example of FIG. 3B, the second target voltage level $468_1$ might be different (e.g., higher) than the initial target voltage level $468_0$, e.g., target voltage level $468_1$ might equal the target voltage level $468_0$ plus a first offset. As will be described in more detail later, the first offset might have a predetermined value. The predetermined value might be determined experimentally, empirically or through simulation to arrive at a value that approaches the efficacy of an erase pulse applied in a continuous fashion without a suspend. Compromises could be made for variances due to the timing of the suspend within the erase pulse flattop.

At time t5, the voltage difference between the waveform 360 and the waveform 362 might reach the target (e.g., desired) magnitude, and the voltage level of the waveform 362 might begin increasing from the initial voltage level at a same rate (e.g., a same ramp rate) as the rate of increase of the voltage level of the waveform 360 to maintain the magnitude of the voltage difference between the waveform 360 and the waveform 362. Note that the target magnitude for generation of GIDL current might be the same despite an increase in the value of the target voltage level of the erase pulse, such that the voltage level of the waveform 362 from time t6 to time t7 might be higher than the voltage level of the waveform 362 from time t2 to time t3.

At time t6, the voltage level of the waveform 360 might reach the second target voltage level $468_1$ for the erase pulse. At this time, the voltage levels of the waveforms 360 and 362 might be maintained, e.g., by ceasing increasing their respective voltage levels. In reference to FIG. 4, the desired levels of GIDL current might be produced after time t5 when the magnitude of the voltage difference between the waveform 360 and the waveform 362 reaches its target level.

The waveform 360 might have a second partial erase pulse flattop $361_2$. A second suspend might be initiated at time t7, and the voltage levels of the waveforms 360 and 362 might be discharged in response. Because a suspend was initiated prior to completion of a desired duration of the erase pulse flattop of the erase pulse of FIG. 4, the duration of the partial erase pulse flattop $361_2$ of FIG. 4 might be shorter than the duration of the erase pulse flattop 361 of FIG. 3A, even where the waveform 360 of FIG. 4 represents a same erase pulse of an erase operation as the waveform 360 of FIG. 3A.

At time t8, the second suspend might be completed and a second resume of the erase pulse might be initiated. As such, at time t8, the voltage level of the waveform 360 might begin increasing (e.g., ramping) from the initial voltage level 364

(e.g., ground or 0V) to a third target (e.g., desired) voltage level $468_2$ while the voltage level of the waveform 362 might remain at the initial voltage level. In contrast to the example of FIG. 3B, the third target voltage level $468_2$ might be different (e.g., higher) than the second target voltage level $468_1$, e.g., target voltage level $468_2$ might equal the target voltage level $468_1$ plus a second offset. As will be described in more detail later, the second offset might have a value determined in response to a combined duration of the partial erase pulse flattops $361_1$ and $361_2$ (e.g., a total number of executed segments of a desired erase pulse flattop of the erase pulse) prior to discharging the voltages following the initiation of the second suspend at time t7.

At time t9, the voltage difference between the waveform 360 and the waveform 362 might reach the target (e.g., desired) magnitude, and the voltage level of the waveform 362 might begin increasing from the initial voltage level at a same rate (e.g., a same ramp rate) as the rate of increase of the voltage level of the waveform 360 to maintain the magnitude of the voltage difference between the waveform 360 and the waveform 362. Note that the target magnitude for generation of GIDL current might be the same despite an increase in the value of the target voltage level of the erase pulse, such that the voltage level of the waveform 362 from time t10 to time t11 might be higher than the voltage level of the waveform 362 from time t6 to time t7.

At time t10, the voltage level of the waveform 360 might reach the third target voltage level $468_2$ for the erase pulse. At this time, the voltage levels of the waveforms 360 and 362 might be maintained, e.g., by ceasing increasing their respective voltage levels. In reference to FIG. 4, the desired levels of GIDL current might be produced after time t9 when the magnitude of the voltage difference between the waveform 360 and the waveform 362 reaches its target level.

The waveform 360 might have a third partial erase pulse flattop $361_3$. At time t11, the erase pulse flattop of the erase pulse might be complete, e.g., a sum of the durations of the first partial erase pulse flattop $361_1$, the second partial erase pulse flattop $361_2$, and the third partial erase pulse flattop $361_3$ of FIG. 4 might equal the duration of the erase pulse flattop 361 of FIG. 3A for corresponding erase pulses of an erase operation. At this time, the erase pulse might be deemed to be complete and the voltage levels of the waveforms 360 and 362 might be discharged.

In contrast to the example of FIG. 3B, the use of increasing target voltage levels following one or more suspends might facilitate higher channel voltage levels during execution of the erase pulse flattop, and might facilitate a level of erase efficacy approaching that of a continuous erase pulse flattop.

Figure 5:
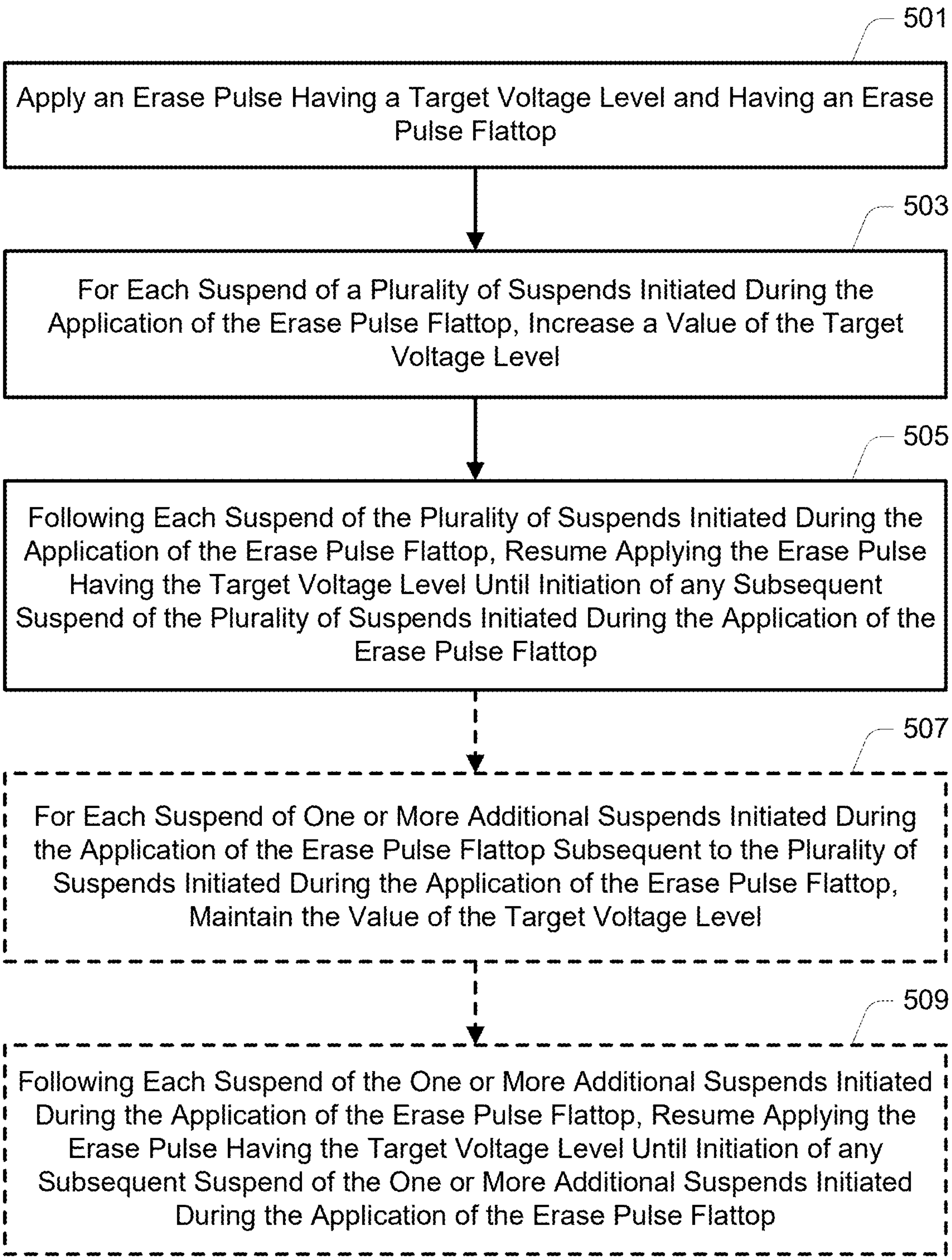
FIG. 5 is a flowchart of a method of operating a NAND memory in accordance with an embodiment.

FIG. 5 is a flowchart of a method of operating a NAND memory in accordance with an embodiment. The method might represent actions associated with an access operation, e.g., an erase operation. The method might be in the form of computer-readable instructions, e.g., stored to the instruction registers 128. Such computer-readable instructions might be executed by a controller, e.g., the control logic 116, to cause the relevant components of the apparatus to perform the method.

At 501, an erase pulse might be applied, e.g., to a common source 216 and/or to a data line 204. The erase pulse might have a target voltage level and might have an erase pulse flattop. The erase pulse flattop might further have a desired duration.

At 503, for each suspend of a plurality of suspends initiated during the application of the erase pulse flattop, a value of the target voltage level might be increased. For a first suspend of the plurality of suspends, the value of the target voltage level might be increased by a first or base offset (e.g., $Offset_0$) having a predetermined value. This predetermined value might be stored to the trim register 127 or other storage location of the memory.

For each remaining suspend of the plurality of suspends, the value of the target voltage level might be increased by a respective offset having a value determined in response to an average duration of the erase pulse flattop executed per suspend. For example, the desired duration of the erase pulse flattop could be divided into a number of segments (e.g., defined periods of time). In response to a suspend being initiated during execution of a segment of the erase pulse flattop, execution of that segment might be completed prior to discharging the waveforms. A total number of segments ($M_n$) executed corresponding to an $n^{th}$ suspend of the plurality of suspends could be divided by a number of suspends initiated by the time of the $n^{th}$ suspend of the plurality of suspends (e.g., n). This value could then be used in conjunction with a lookup table to determine the respective offset for that suspend of the plurality of suspends. Note that the offsets might be cumulative. For example, the target voltage level following a first suspend initiated during application of the erase pulse flattop might be the original target voltage level plus the first offset, while the target voltage level following a second suspend initiated during application of the erase pulse flattop might be the target voltage level following the first suspend initiated during application of the erase pulse flattop plus a second offset, the target voltage level following a third suspend initiated during application of the erase pulse flattop might be the target voltage level following the second suspend initiated during application of the erase pulse flattop plus a third offset, and so on.

Table 1 depicts one possible relationship between the average duration of the erase pulse flattop per suspend for various values of such an average from $Avg_1$ to $Avg_{12}$, where $Avg_1<Avg_2<Avg_3<Avg_4<Avg_5<Avg_6<Avg_7<Avg_8<Avg_9<Avg_{10}<Avg_{11}<Avg_{12}$, as determined for an $n^{th}$ suspend of the plurality of suspends where n is an integer value of 2 or higher. Note that absolute values of the averages $Avg_1$ to $Avg_{12}$ might generally depend on the selected design parameters, e.g., a number of segments per erase pulse flattop. Generally speaking, a value of the average duration of the erase pulse flattop per suspend might range from a value of 1, e.g., a suspend initiated during execution of each segment of the erase pulse flattop, to a value equal to a total number of segments contained in the desired duration of the erase pulse flattop divided by 2. While Table 1 contains twelve entries for average duration of the erase pulse flattop per suspend, other numbers of entries could be used.

TABLE 1

Target Voltage Level Offset as Function of Average Duration of an Erase Pulse Flattop

| $M_n/n$ | | |
|---|---|---|
| Greater Than or Equal To | Less Than | Desired Offset |
| | $Avg_1$ | $Offset_1$ |
| $Avg_1$ | $Avg_2$ | $Offset_2$ |
| $Avg_2$ | $Avg_3$ | $Offset_3$ |
| $Avg_3$ | $Avg_4$ | $Offset_4$ |
| $Avg_4$ | $Avg_5$ | $Offset_5$ |
| $Avg_5$ | $Avg_6$ | $Offset_6$ |
| $Avg_6$ | $Avg_7$ | $Offset_7$ |

TABLE 1-continued

| Target Voltage Level Offset as Function of Average Duration of an Erase Pulse Flattop | | |
|---|---|---|
| $M_n$/n | | |
| Greater Than or Equal To | Less Than | Desired Offset |
| $Avg_7$ | $Avg_8$ | $Offset_8$ |
| $Avg_8$ | $Avg_9$ | $Offset_9$ |
| $Avg_9$ | $Avg_{10}$ | $Offset_{10}$ |
| $Avg_{10}$ | $Avg_{11}$ | $Offset_{11}$ |
| $Avg_{11}$ | $Avg_{12}$ | $Offset_{12}$ |

Table 1 might be stored to the trim register 127 or other storage location of the memory. For some embodiments, the values of the desired offset might have a decreasing relationship $Offset_1>=Offset_2>=Offset_3>=Offset_4>=Offset_5>=Offset_6>=Offset_7>=Offset_8>=Offset_9>=Offset_{10}>=Offset_{11}>=Offset_{12}$. These values might be determined experimentally, empirically or through simulation to arrive at values that approach the efficacy of an erase pulse applied in a continuous fashion without a suspend. Compromises could be made for variances due to the timing of the suspends within the erase pulse flattop. While a decreasing relationship might be appropriate for some embodiments, other embodiments might utilize a different relationship determined experimentally, empirically or through simulation. For example, while a desired offset (e.g., $Offset_x$) for a first value of average duration (e.g., $Avg_x$) might be greater than or equal to a desired offset (e.g., $Offset_{x+1}$) for a second value of average duration (e.g., $Avg_{x+1}$ where $Avg_{x+1}>Avg_x$), the desired offset (e.g., $Offset_{x+1}$) for the second value of average duration (e.g., $Avg_{x+1}$) could be less than a desired offset (e.g., $Offset_{x+2}$) for a third value of average duration (e.g., $Avg_{x+2}$ where $Avg_{x+2}>Avg_{x+1}$).

The example of Table 1 might be simplified by looking only to discrete values of the average duration. Table 2 depicts another possible relationship between the average duration of the erase pulse flattop per suspend for various values of such an average from $Avg_1$ to $Avg_{12}$ as determined for an $n^{th}$ suspend of the plurality of suspends where n is an integer value of 2 or higher. While Table 2 contains twelve entries for average duration of the erase pulse flattop per suspend, other numbers of entries could be used.

TABLE 2

| Target Voltage Level Offset as Function of Average Duration of an Erase Pulse Flattop | |
|---|---|
| $M_n$/n | Offset |
| $Avg_1$ | $Offset_1$ |
| $Avg_2$ | $Offset_2$ |
| $Avg_3$ | $Offset_3$ |
| $Avg_4$ | $Offset_4$ |
| $Avg_5$ | $Offset_5$ |
| $Avg_6$ | $Offset_6$ |
| $Avg_7$ | $Offset_7$ |
| $Avg_8$ | $Offset_8$ |
| $Avg_9$ | $Offset_9$ |
| $Avg_{10}$ | $Offset_{10}$ |
| $Avg_{11}$ | $Offset_{11}$ |
| $Avg_{12}$ | $Offset_{12}$ |

In using a lookup table such as Table 2, embodiments might seek to interpolate between values when no exact match exists. Alternatively, embodiments might select the value of the table that is closest to the determined value, e.g., the determined value indicative of the average duration of the erase pulse flattop per suspend. Similarly, embodiments might simply round or truncate determined values of the average duration of the erase pulse flattop per suspend.

As an alternative to lookup tables, the determination of desired offsets could be defined as a decreasing function of the determined average duration of the erase pulse flattop per suspend, e.g., $f(M_n/n)$, for some embodiments. For various decreasing functions of average duration, a value of the desired offset for some particular average duration might be less than or equal to the value of the desired offset at each lesser relevant average duration, and might be less than the value of the desired offset for at least a subset of lesser relevant average durations. The value of the desired offset for the particular average duration might further be greater than or equal to the value of the desired offset at each greater relevant average duration, and might be greater than the value of the desired offset for at least a subset of greater relevant average durations. For some embodiments, each value of the desired offset for any relevant average duration is less than or equal to the value of the desired offset at each lesser relevant average duration, and less than the value of the desired offset for at least a subset of lesser relevant average durations. The function might be expressed as a polynomial equation, and the coefficients of the polynomial equation might be stored to the trim register 127 or other storage location of the memory. While a decreasing function might be appropriate for some embodiments, other embodiments might utilize a different function determined experimentally, empirically or through simulation, similar to that described with reference to Table 1.

At 505, following each suspend of the plurality of suspends initiated during the application of the erase pulse flattop, the memory might resume applying the erase pulse having its target voltage level (e.g., a respective target voltage level for a suspend of the plurality of suspends) until initiation of any subsequent suspend of the plurality of suspends initiated during the application of the erase pulse flattop. That is, the memory might ramp up the voltage level applied to a node, e.g., one or more nodes selected from the common source 216 and/or the data line 204, to its target voltage level to resume the erase pulse flattop.

For some embodiments, the target voltage level of the erase pulse might have a limit to any applied offsets such that the target voltage level for resuming an erase pulse might be limited to a value equal to the initial target voltage level for that erase pulse prior to initiating any suspends plus a maximum offset (e.g., $Offset_{max}$). The maximum offset might be a predetermined value stored to the trim register 127 or other storage location of the memory. For such embodiments, the maximum offset from the initial target voltage level might be attained for a last suspend of the plurality of suspends. If the erase pulse flattop has not been executed for its full desired duration, the process might optionally continue to 507. The maximum offset might be determined experimentally, empirically or through simulation to arrive at a value that mitigates excessive erasure.

At 507, for each suspend of one or more additional suspends initiated during the application of the erase pulse flattop, a value of the target voltage level might be maintained, e.g., might not be further increased. At 509, following each suspend of the one or more additional suspends initiated during the application of the erase pulse flattop, the memory might resume applying the erase pulse having its target voltage level (e.g., the target voltage level limit for that erase pulse) until initiation of any subsequent suspend of the one or more additional suspends initiated during the application of the erase pulse flattop. That is, the memory might ramp up the voltage level applied to a node, e.g., at least one node selected from the common source 216 and/or the data line 204, to its target voltage level to resume the erase pulse flattop.

Figure 6:
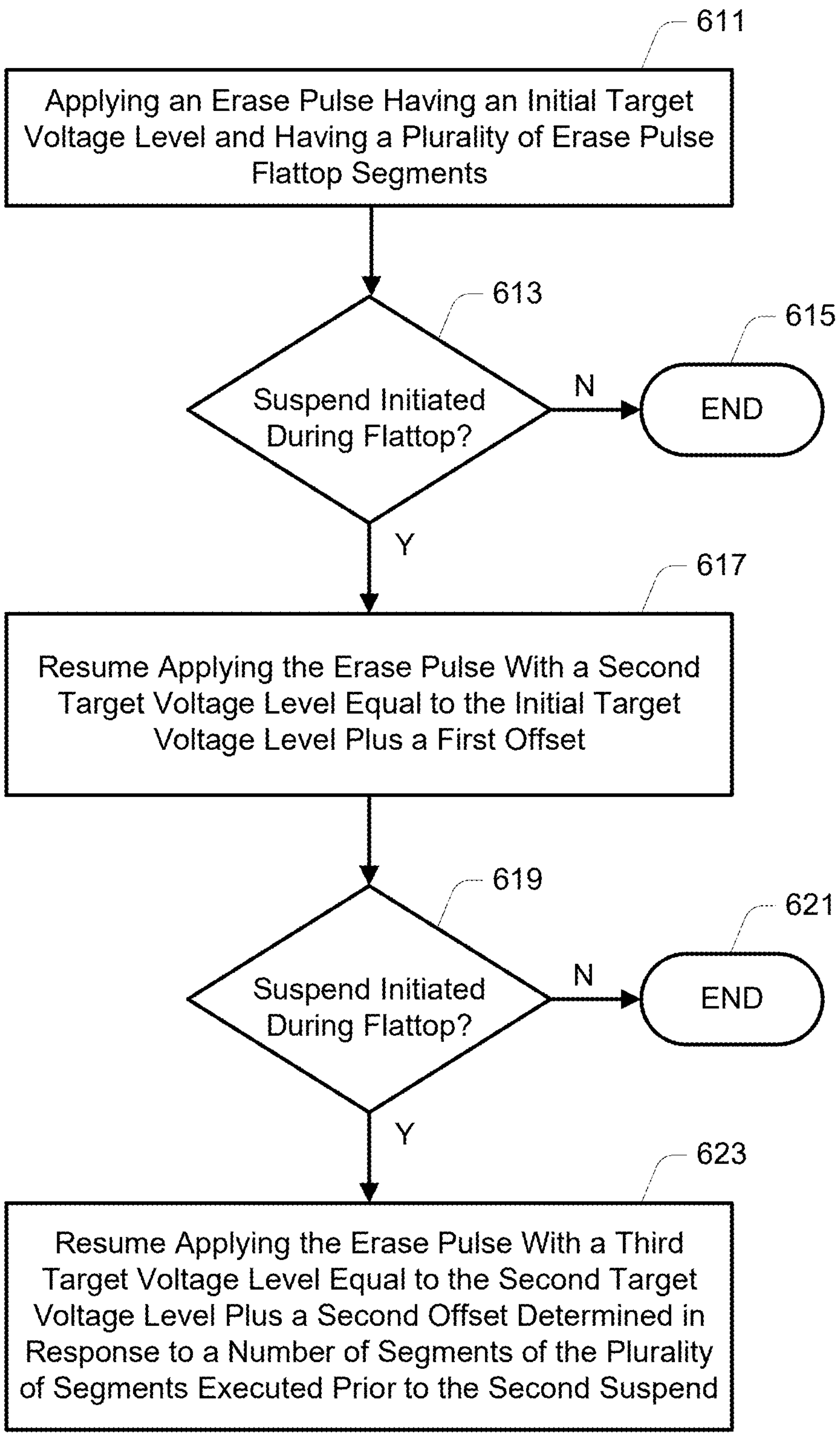
FIG. 6 is a flowchart of a method of operating a NAND memory in accordance with another embodiment.

FIG. 6 is a flowchart of a method of operating a NAND memory in accordance with an embodiment. The method might represent actions associated with an access operation, e.g., an erase operation. The method might be in the form of computer-readable instructions, e.g., stored to the instruction registers 128. Such computer-readable instructions might be executed by a controller, e.g., the control logic 116, to cause the relevant components of the apparatus to perform the method.

At 611, an erase pulse having an initial target voltage level and having a plurality of erase pulse flattop segments might be applied. That is, the memory might ramp up the voltage level applied to a node, e.g., at least one node selected from the common source 216 and/or the data line 204, to the initial target voltage level and maintain the voltage level applied to the node for one or more segments of the plurality of erase pulse flattop segments.

At 613, it might be determined whether a suspend was initiated during execution of any segment of the plurality of erase pulse flattop segments. The suspend might be initiated in response to a command from an external controller or autonomously by the memory. If no suspend was initiated during execution of any segment of the plurality of erase pulse flattop segments at 613, the process might end at 615. Note that a suspend might be initiated prior to executing any segments of the plurality of erase pulse flattop segments or after execution of all segments of the plurality of erase pulse flattop segments. The process of FIG. 6 does not address these scenarios, and resumption of the erase pulse in such cases might proceed in any known manner.

If a suspend (e.g., a first suspend) was initiated during execution of any segment of the plurality of erase pulse flattop segments at 613, the process might proceed to 617. At 617, the memory might resume applying the erase pulse with a second target voltage level equal to the initial target voltage level plus a first offset. The first offset might be a predetermined value and might be stored to the trim register 127 or other storage location of the memory. The memory might ramp up the voltage level applied to the node to the second target voltage level to resume the erase pulse flattop. The value of the first offset might be determined experimentally, empirically or through simulation to arrive at a value that approaches the efficacy of an erase pulse applied in a continuous fashion without a suspend. Compromises could be made for variances due to the timing of the suspend within the erase pulse flattop.

At 619, it might be determined whether a suspend was initiated during execution of any segment (e.g., any remaining segment) of the plurality of erase pulse flattop segments, e.g., while the erase pulse has the second target voltage level. The suspend might be initiated in response to a command from an external controller or autonomously by the memory. If no suspend was initiated during execution of any segment of the plurality of erase pulse flattop segments at 619, the process might end at 621. Note that a suspend might be initiated prior to executing any segments of the plurality of erase pulse flattop segments or after execution of all segments of the plurality of erase pulse flattop segments. The process of FIG. 6 does not address these scenarios, and resumption of the erase pulse in such cases might proceed in any known manner.

If a suspend (e.g., a second suspend) was initiated during execution of any segment of the plurality of erase pulse flattop segments while the erase pulse had the second target voltage level at 619, the process might proceed to 623. At 623, the memory might resume applying the erase pulse with a third target voltage level equal to the second target voltage level plus a second offset. The second offset might be determined in response to a number of segments of the plurality of erase pulse flattop segments that were executed prior to the second suspend. A segment of the plurality of erase pulse flattop segments will be deemed to be executed prior to a suspend if its execution begins prior to initiation of that suspend and its execution is completed prior to completion of that suspend. The second offset might be determined as discussed with reference to FIG. 5, e.g., through the use of a lookup table or direct calculation from a defined function. The value of the second offset might be determined experimentally, empirically or through simulation to arrive at a value that approaches the efficacy of an erase pulse applied in a continuous fashion without a suspend. Compromises could be made for variances due to the timing of the suspend within the erase pulse flattop.

The memory might ramp up the voltage level applied to the node to the third target voltage level to resume the erase pulse flattop. This process might be completed in like manner until all segments of the plurality of erase pulse flattop segments have been executed, with additional determinations whether a suspend was initiated during execution of any segment (e.g., any remaining segment) of the plurality of erase pulse flattop segments, and with additional target voltage levels generated from additional offsets determined in response to a number of segments of the plurality of erase pulse flattop segments that were executed prior to each additional suspend. For some embodiments, a maximum target voltage level (e.g., the initial target voltage level plus a maximum offset) might be defined, and no further increases in the target voltage level might be calculated prior to resuming applying the erase pulse.

Figure 7A:
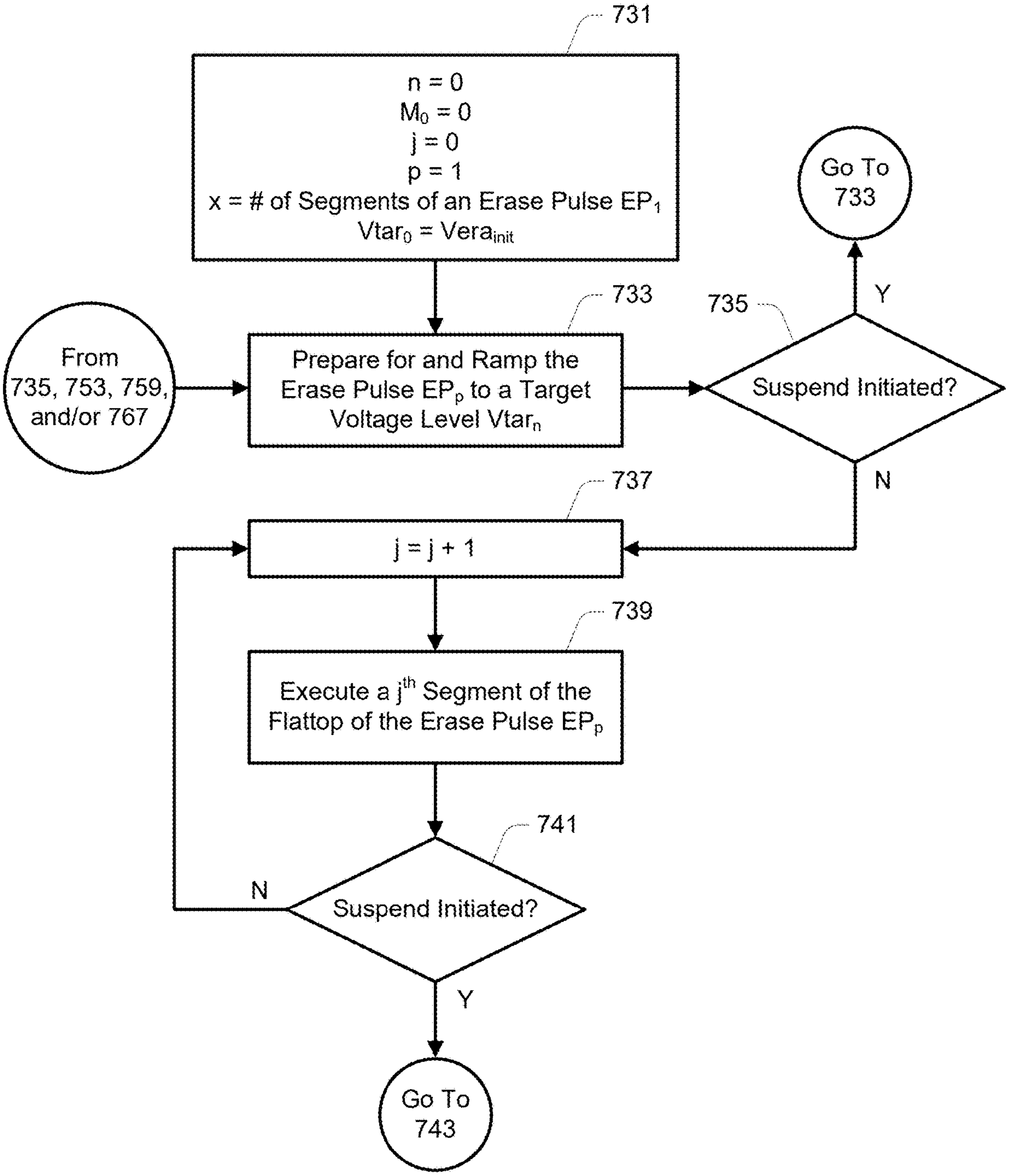
FIGS. 7A-7C are a flowchart of a method of operating a NAND memory in accordance with a further embodiment.
Figure 7B:
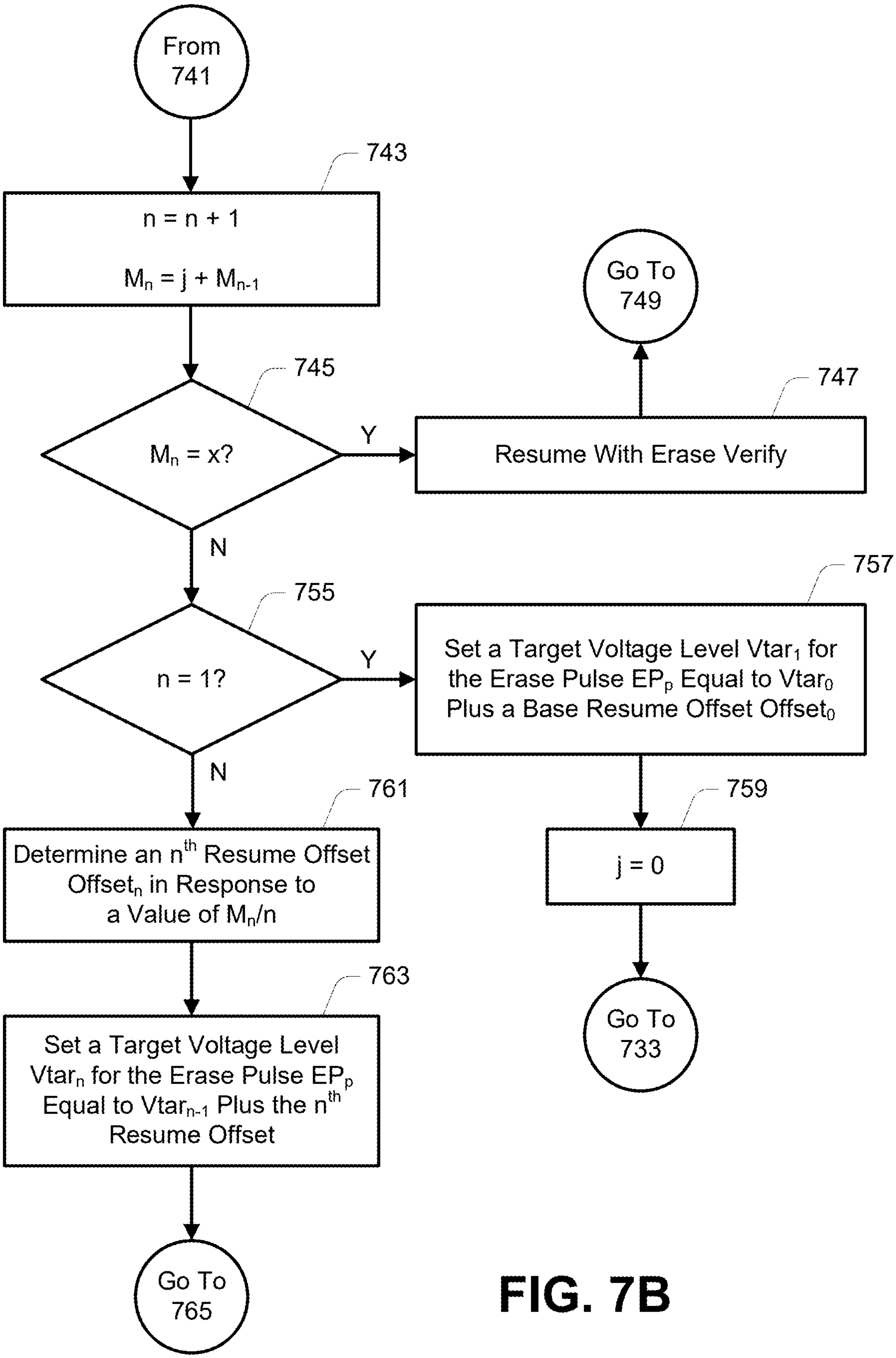
Figure 7C:
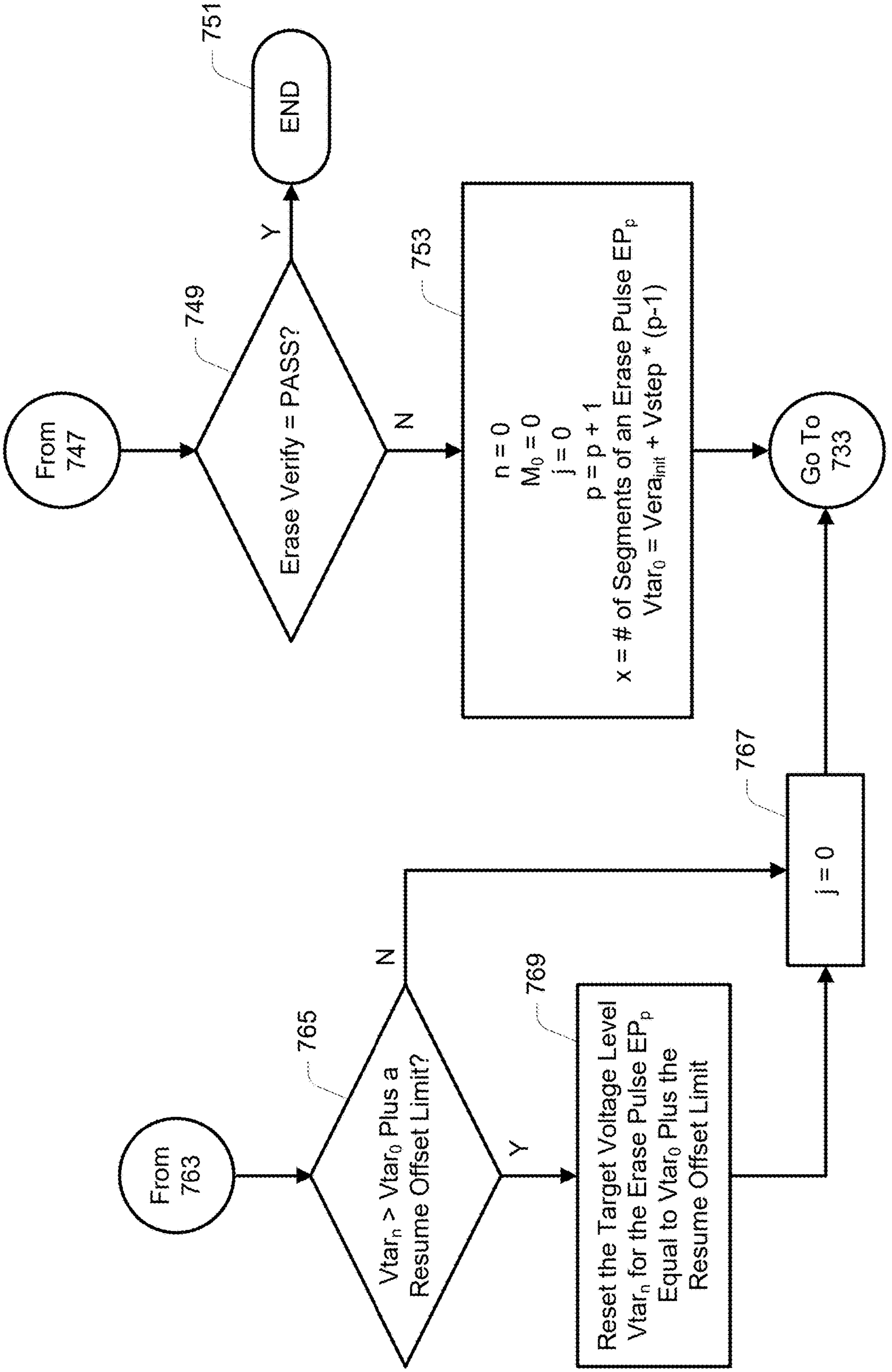

FIGS. 7A-7C are a flowchart of a method of operating a NAND memory in accordance with an embodiment. The method might represent actions associated with an access operation, e.g., an erase operation. The method might be in the form of computer-readable instructions, e.g., stored to the instruction registers 128. Such computer-readable instructions might be executed by a controller, e.g., the control logic 116, to cause the relevant components of the apparatus to perform the method.

At 731, values of a number of variables might be defined. For example, n=0, $M_0$=0, j=0, p=1. The variable n might represent a number of suspends initiated during execution of an erase pulse flattop. $M_0$ might be used in calculating a total number of segments of the erase pulse flattop executed prior to the first suspend initiated during execution of an erase pulse flattop. The variable j might represent a counter for a number of segments of the erase pulse flattop executed between a first application of the erase pulse and a first suspend, or between any resumption of applying the erase pulse and a subsequent suspend. The variable p might represent a counter for a number of erase pulses applied during the erase operation. Other values might also be defined, such as x might be set to equal a number of segments of an erase pulse $EP_1$, e.g., a first erase pulse of an erase operation. In addition, $Vtar_0$ might be set to equal an initial target voltage level (e.g., $Vera_{init}$) of the first erase pulse $EP_1$.

At 733, the memory might prepare for and ramp the erase pulse $EP_p$ to a target voltage level $Vtar_n$. This phase can include startup overhead operations, such as a partial block erase check, a pre-program phase to mitigate over erasure, and ramping the erase pulse and control line voltages to generate GIDL current and reach the erase pulse flattop. At 735, it might be determined whether a suspend was initiated during this phase of the erase operation. The suspend might be initiated in response to a command from an external controller or autonomously by the memory. If a suspend was initiated during this phase of the erase operation, the process might return to 733 upon resumption of the erase operation. If no suspend was initiated during this phase, the process might proceed to 737.

At 737, j might be incremented by 1. At 739, a $j^{th}$ segment of the flattop of the erase pulse $EP_p$ might be executed. In other words, the erase pulse $EP_p$ might be maintained at its target voltage level $Vtar_n$ for a period of time corresponding to the $j^{th}$ segment. While all segments of the erase pulse $EP_p$ might have a same duration, this is not required. At 741, it might be determined whether a suspend was initiated during the execution of the $j^{th}$ segment of the flattop of the erase pulse $EP_p$. If no suspend was initiated during execution of the $j^{th}$ segment of the flattop of the erase pulse $EP_p$, the process might return to 737. If a suspend was initiated during execution of the $j^{th}$ segment of the flattop of the erase pulse $EP_p$, the process might proceed to 743 upon resumption of the erase operation.

At 743, n might be incremented by 1, indicating that a suspend (e.g., another suspend) has been initiated. The variable $M_n$ might be set to equal the current value of j plus the value of $M_{n-1}$.

At 745, it might be determined whether $M_n$=x, e.g., whether all segments of the erase pulse $EP_p$ have been executed. If all segments of the erase pulse $EP_p$ have been executed at 745, e.g., $M_n$=x, the process might proceed to 747 and an erase verify might be performed following completion of the $n^{th}$ suspend.

At 749, it might be determined whether the erase verify passed, e.g., whether the erase operation is complete. If the erase verify passed at 749, the process might end at 751. If the erase verify failed at 749, a next erase pulse might be performed and the process might proceed to 753. At 753, variables might be reset, with n=0, $M_0$=0, and j=0 for the next erase pulse. The variable p might be incremented by 1, indicating the next erase pulse. A first erase pulse of an erase operation typically has a longer desired duration for its flattop than subsequent erase pulses of the erase operation. As such, the value of x might also be reset to equal the number of segments of the flattop of the erase pulse $EP_p$ having the incremented value of p. In addition, each subsequent erase pulse is typically a step voltage (e.g., Vstep) higher than its immediately preceding erase pulse. As such, the value of $Vtar_0$ for the erase pulse $EP_p$ might be set to equal the initial target voltage level $Vera_{init}$ plus the value of Vstep times (p−1). The process might then return to 733.

If all segments of the erase pulse $EP_p$ have not been executed at 745, e.g., $M_n$<x, the process might proceed to 755. At 755, it might be determined whether n=1. If n=1 at 755, the process might proceed to 757 and a target voltage level $Vtar_1$ for the erase pulse $EP_p$ might be set to equal $Vtar_0$ plus a base resume offset (e.g., $Offset_0$). The base resume offset $Offset_0$ might be a predetermined value as previously discussed. At 759, j might be reset to 0 and the process might return to 733 upon resumption of the erase operation.

If n is not equal to 1 at 755, the process might proceed to 761 and an $n^{th}$ resume offset (e.g., $Offset_n$) might be determined in response to a value of $M_n$/n. This $n^{th}$ resume offset $Offset_n$ might be determined using a lookup table or coefficients of a function as previously discussed. The process might proceed to 763 and an $n^{th}$ target voltage level $Vtar_n$ of the erase pulse $EP_p$ might be set to equal $Vtar_{n-1}$ plus the $n^{th}$ resume offset $Offset_n$.

At 765, it might be determined whether the $n^{th}$ target voltage level $Vtar_n$ is greater than the target voltage level $Vtar_0$ plus a resume offset limit $Offset_{max}$. If the $n^{th}$ target voltage level $Vtar_n$ is less than or equal to the target voltage level $Vtar_0$ plus the resume offset limit $Offset_{max}$, the process might proceed to 767 to reset the variable j to 0 and the process might return to 733. If the $n^{th}$ target voltage level $Vtar_n$ is greater than the target voltage level $Vtar_0$ plus the resume offset limit $Offset_{max}$ at 765, the process might proceed to 769 and the $n^{th}$ target voltage level $Vtar_n$ for the erase pulse $EP_p$ might be reset to equal to the target voltage level $Vtar_0$ plus the resume offset limit $Offset_{max}$. The process might then proceed to 767 to reset the variable j to 0, and return to 733 upon resumption of the erase operation.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:

an array of memory cells comprising a plurality of strings of series-connected memory cells; and a controller for access of the array of memory cells, wherein the controller is configured to cause the memory to:

apply an erase pulse having a target voltage level and having an erase pulse flattop;

for each suspend of a plurality of suspends initiated during the application of the erase pulse flattop, increase a value of the target voltage level; and following each suspend of the plurality of suspends initiated during the application of the erase pulse flattop, resume applying the erase pulse having the target voltage level until initiation of any subsequent suspend of the plurality of suspends initiated during the application of the erase pulse flattop.

2. The memory of claim 1, wherein the controller being configured to increase the value of the target voltage level for a first suspend of the plurality of suspends comprises the controller being configured to increase the value of the target voltage level by a first offset having a predetermined value.

3. The memory of claim 2, wherein the controller being configured to increase the value of the target voltage level for a second suspend of the plurality of suspends comprises the controller being configured to increase the value of the target voltage level by a second offset having a value determined in response to a total duration of the erase pulse flattop executed prior to the second suspend divided by 2.

4. The memory of claim 3, wherein the total duration of the erase pulse flattop executed prior to the second suspend includes a duration of the erase pulse flattop executed following initiation of the second suspend and prior to discharge of the erase pulse.

5. The memory of claim 3, wherein the controller being configured to increase the value of the target voltage level for the first suspend of the plurality of suspends comprises the controller being configured to increase the value of the target voltage level to a second target voltage level equal to an initial target voltage level plus the first offset, and wherein the controller being configured to increase the value of the target voltage level for the second suspend of the plurality of suspends comprises the controller being configured to increase the value of the target voltage level to a third target voltage level equal to the second target voltage level plus the second offset.

6. The memory of claim 1, wherein the controller is further configured to cause the memory to:

for each suspend of one or more additional suspends initiated during the application of the erase pulse flattop, maintain the value of the target voltage level; and following each suspend of the one or more additional suspends initiated during the application of the erase pulse flattop, resume applying the erase pulse having the target voltage level until initiation of any subsequent suspend of the one or more additional suspends initiated during the application of the erase pulse flattop.

7. The memory of claim 1, wherein the controller being configured to cause the memory to resume applying the erase pulse following each suspend of the plurality of suspends comprises the controller being configured to cause the memory to resume applying the erase pulse following each suspend of the plurality of suspends without performing an erase verify prior to resuming applying the erase pulse.

8. A memory, comprising:

an array of memory cells comprising a plurality of strings of series-connected memory cells; and a controller for access of the array of memory cells, wherein the controller is configured to cause the memory to:

apply an erase pulse having an initial target voltage level and having a plurality of erase pulse flattop segments;

determine whether a first suspend is initiated during execution of a segment of the plurality of erase pulse flattop segments;

in response to the first suspend being initiated during execution of a segment of the plurality of erase pulse flattop segments, resume applying the erase pulse with a second target voltage level equal to the initial target voltage level plus a first offset;

determine whether a second suspend is initiated during execution of a segment of the plurality of erase pulse flattop segments; and in response to the second suspend being initiated during execution of a segment of the plurality of erase pulse flattop segments, resume applying the erase pulse with a third target voltage level equal to the second target voltage level plus a second offset determined in response to a number of segments of the plurality of erase pulse flattop segments executed prior to the second suspend.

9. The memory of claim 8, wherein a segment of the plurality of erase pulse flattop segments is deemed to be executed prior to the second suspend if that segment of the plurality of erase pulse flattop segments is initiated prior to initiation of the second suspend and is executed to completion prior to completion of the second suspend.

10. The memory of claim 8, wherein the controller is further configured to cause the memory to:

determine whether a third suspend is initiated during execution of a segment of the plurality of erase pulse flattop segments; and in response to the third suspend being initiated during execution of a segment of the plurality of erase pulse flattop segments, resume applying the erase pulse with a fourth target voltage level equal to the third target voltage level plus a third offset determined in response to a number of segments of the plurality of erase pulse flattop segments executed prior to the third suspend.

11. The memory of claim 10, wherein the third offset is less than or equal to the second offset.

12. The memory of claim 8, wherein the second offset is determined by determining a value of the number of segments of the plurality of erase pulse flattop segments executed prior to the second suspend divided by two, and comparing the determined value to values of a lookup table.

13. The memory of claim 12, wherein comparing the determined value to the values of the lookup table comprises modifying the determined value using a transformation selected from a group consisting of rounding and truncating the determined value.

14. The memory of claim 12, wherein comparing the determined value to the values of the lookup table comprises interpolating between the values of the lookup table.

15. The memory of claim 8, wherein the second offset is determined by determining a value of the number of segments of the plurality of erase pulse flattop segments executed prior to the second suspend divided by two, and calculating the second offset as a function of the determined value.

16. A memory, comprising:

an array of memory cells comprising a plurality of strings of series-connected memory cells; and a controller for access of the array of memory cells, wherein the controller is configured to cause the memory to:

apply an erase pulse having a target voltage level and having an erase pulse flattop;

for each suspend of a plurality of suspends initiated during the application of the erase pulse flattop, increase a value of the target voltage level by a respective offset for each suspend of the plurality of suspends initiated during the application of the erase pulse flattop; and following each suspend of the plurality of suspends initiated during the application of the erase pulse flattop, resume applying the erase pulse having the respective target voltage level for that suspend of the plurality of suspends initiated during the application of the erase pulse flattop until initiation of any subsequent suspend of the plurality of suspends initiated during the application of the erase pulse flattop.

17. The memory of claim 16, wherein the respective offset for any suspend of the plurality of suspends is greater than or equal to the respective offset for each subsequent suspend of the plurality of suspends, and less than or equal to the respective offset for each prior suspend of the plurality of suspends.

18. The memory of claim 16, wherein the respective offset for a first suspend of the plurality of suspends has a predetermined value, and the respective offset for each remaining suspend of the plurality of suspends has a value determined in response to a duration of the erase pulse flattop executed prior to that remaining suspend of the plurality of suspends.

19. The memory of claim 18, wherein a duration of the erase pulse flattop executed prior to any remaining suspend of the plurality of suspends includes duration of the erase pulse flattop executed after initiation of that remaining suspend of the plurality of suspends and prior to completion of that remaining suspend of the plurality of suspends.

20. The memory of claim 16, wherein the controller is further configured to cause the memory to:

for each suspend of one or more additional suspends initiated during the application of the erase pulse flattop, maintain the value of the target voltage level; and following each suspend of the one or more additional suspends initiated during the application of the erase pulse flattop, resume applying the erase pulse having the maintained target voltage level.

* * * * *